(12) United States Patent
Park et al.

(10) Patent No.: US 11,530,487 B2
(45) Date of Patent: Dec. 20, 2022

(54) METHOD OF GENERATING ARTIFICIAL LATENT FINGERPRINTS FOR LATENT FINGERPRINT DEVELOPMENT EXPERIMENTS

(71) Applicant: REPUBLIC OF KOREA (NATIONAL FORENSIC SERVICE DIRECTOR MINISTRY OF THE INTERIOR AND SAFETY), Wonju-si (KR)

(72) Inventors: Nam Kyu Park, Bucheon-si (KR); Byung Seon Moon, Busan (KR); Jae Mo Goh, Wonju-si (KR); Jin Pyo Kim, Daejeon (KR); Young Il Seo, Wonju-si (KR); Eun Ah Joo, Yongin-si (KR); Je Hyun Lee, Wonju-si (KR); Sang Yoon Lee, Wonju-si (KR); Jae Hyeok Yi, Seoul (KR)

(73) Assignee: REPUBLIC OF KOREA (NATIONAL FORENSIC SERVICE DIRECTOR MINISTRY OF THE INTERIOR AND SAFETY), Wonju-si (KR)

( * ) Notice: Subject to any disclaimer, the term of this patent is extended or adjusted under 35 U.S.C. 154(b) by 19 days.

(21) Appl. No.: 17/360,813

(22) Filed: Jun. 28, 2021

(65) Prior Publication Data
US 2022/0342298 A1 Oct. 27, 2022

(30) Foreign Application Priority Data

Apr. 21, 2021 (KR) ........................ 10-2021-0051765

(51) Int. Cl.
 *C23F 1/18* (2006.01)
 *G03F 7/00* (2006.01)
 *B41M 1/36* (2006.01)

(52) U.S. Cl.
 CPC ................ *C23F 1/18* (2013.01); *B41M 1/36* (2013.01); *G03F 7/0002* (2013.01)

(58) Field of Classification Search
 CPC ............ C23F 1/18; B41M 1/36; G03F 7/0002
 (Continued)

(56) References Cited

U.S. PATENT DOCUMENTS

| 4,407,842 | A | * | 10/1983 | Shepard | ............... | A61B 5/1172 |
| | | | | | | 156/241 |
| 5,611,279 | A | * | 3/1997 | Ando | ..................... | B41C 1/055 |
| | | | | | | 101/401.1 |
| 7,182,817 | B1 | * | 2/2007 | Weaver | ............... | A61B 5/1172 |
| | | | | | | 118/715 |

FOREIGN PATENT DOCUMENTS

| KR | 10-1612343 | B1 | | 4/2016 | | |
| KR | 101612343 | B1 | * | 4/2016 | ............ | G06K 19/06 |

* cited by examiner

*Primary Examiner* — Duy Vu N Deo
(74) *Attorney, Agent, or Firm* — Hauptman Ham, LLP

(57) ABSTRACT

A method of generating artificial latent fingerprints for latent fingerprint development experiments includes: printing an artificially created fingerprint shape on paper for application to a target surface; thermally transferring the fingerprint shape printed on the paper to an etching plate by applying a certain range of heat and pressure to the paper on which the fingerprint shape is printed; forming a three-dimensional fingerprint shape on the etching plate by performing an etching process according to the fingerprint shape transferred to the etching plate; patterning the three-dimensional fingerprint shape formed on the etching plate with a molding member; and forming a latent fingerprint on the target surface using an artificial fingerprint solution from the three-dimensional fingerprint shape formed by patterning with the molding member.

7 Claims, 3 Drawing Sheets

(58) Field of Classification Search
USPC .................................................. 216/100–105
See application file for complete search history.

(a)

(b)

METHOD OF GENERATING ARTIFICIAL LATENT FINGERPRINTS FOR LATENT FINGERPRINT DEVELOPMENT EXPERIMENTS

CROSS-REFERENCE TO RELATED APPLICATION

This application claims the benefit of Korean Patent Application No. 10-2021-0051765, filed on Apr. 21, 2021, in the Korean Intellectual Property Office, the disclosure of which is incorporated herein in its entirety by reference.

BACKGROUND

1. Field

One or more embodiments relate to a method of generating artificial latent fingerprints for latent fingerprint development experiments.

2. Description of the Related Art

Fingerprint evidence found at the crime scene is important evidence that may identify a suspect.

A latent fingerprint refers to a fingerprint shape that remains as evidence by natural secretions from human skin, but cannot be seen with the naked eye. Most fingerprints generated at crime scenes exist in the form of latent fingerprints. Therefore, the technique of developing these latent fingerprints to the naked eye is very important.

As described above, the technique of developing latent fingerprints to make latent fingerprints visible to the naked eye varies depending on a target surface to be developed and the environment. In an experiment to evaluate a fingerprint reagent or method for the development of the technique of developing latent fingerprints, a method of generating a fingerprint by directly touching a human finger with a target surface is used. In such an experiment, unnecessary personal fingerprint information is included, and a wasteful procedure is required to obtain permission from the Institutional Review Board (IRB) for all experiments.

However, artificially created fingerprints, not human fingerprints, may be found only by simple search on the Internet. In this way, when an artificially created fingerprint shape is used during the experiment for the development of the technique of developing latent fingerprints, an approval procedure of the IRB may be omitted.

Currently, latent fingerprints that may be artificially generated may only be generated on a flat surface such as printing paper or transparent label paper through an inkjet printer. Accordingly, there is a problem that artificial latent fingerprints are not generated on the surface of various objects such as metal, glass, corrugated cardboard, and wood, as found at crime scenes.

[Prior art document] Korean Patent No. 10-1612343 (registered on Apr. 7, 2016)

SUMMARY

One or more embodiments include a method of generating artificial latent fingerprints for latent fingerprint development experiments, in more detail, a method of forming a human fingerprint shape on a molding member such as silicone or gelatin to generate latent fingerprints on various target surfaces rather than flat surfaces as found in crime scenes.

One or more embodiments include a method of simplifying the procedure of a latent fingerprint development experiment by omitting an approval procedure of the Institutional Review Board (IRB) by using artificially created fingerprints instead of directly using human fingerprints.

According to one or more embodiments, a method of generating artificial latent fingerprints for latent fingerprint development experiments includes: printing an artificially created fingerprint shape on paper for application to a target surface; thermally transferring the fingerprint shape printed on the paper to an etching plate by applying a certain range of heat and pressure to the paper on which the fingerprint shape is printed; forming a three-dimensional fingerprint shape on the etching plate by performing an etching process according to the fingerprint shape transferred to the etching plate; patterning the three-dimensional fingerprint shape formed on the etching plate with a molding member; and forming a latent fingerprint on the target surface using an artificial fingerprint solution from the three-dimensional fingerprint shape formed by patterning with the molding member.

The printing of the fingerprint shape on paper may be performed by a laser printer or an inkjet printer.

The thermal transferring may be performed at a heating temperature of 200° C. or higher when the etching plate is made of copper.

The forming of the three-dimensional fingerprint shape on the etching plate may be performed using an etchant in which 23% hydrochloric acid, 35% hydrogen peroxide, and water are mixed in a 1:1:1 ratio when the etching plate is made of copper.

The molding member may include gelatin or silicone.

A target member on which the target surface is formed may include metal, glass, corrugated board, or wood.

The artificial fingerprint solution may include a human body fluid component.

Additional aspects will be set forth in part in the description which follows and, in part, will be apparent from the description, or may be learned by practice of the presented embodiments.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
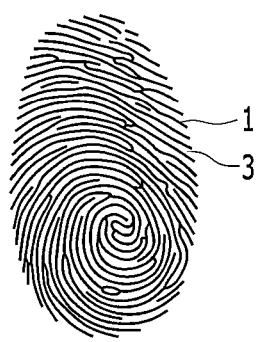
FIG. 1 is an exemplary view of a general fingerprint shape found on a surface of an object and a fingerprint shape in which the color of the general fingerprint shape is inverted.
Figure 1:
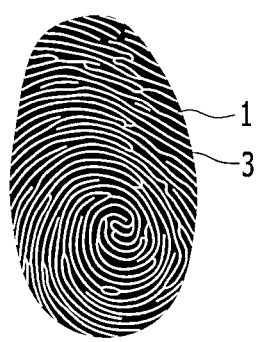

Hereinafter, embodiments will be described in detail with reference to the accompanying drawings. The same reference numerals are used to denote the same elements, and repeated descriptions thereof will be omitted.

It will be understood that although the terms "first," "second," etc. may be used herein to describe various components, these components should not be limited by these terms.

An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of description, the following embodiments are not limited thereto. When a certain embodiment may be implemented differently, a specific process order may be performed differently from the described order. For example, two consecutively described processes may be performed substantially at the same time or performed in an order opposite to the described order.

It will be understood that when a layer, region, or component is connected to another portion, the layer, region, or component may be directly connected to the portion or an intervening layer, region, or component may exist. For example, when a layer, region, or component is electrically connected to another portion, the layer, region, or component may be directly electrically connected to the portion or may be indirectly electrically connected to the portion through another layer, region, or component.

In this specification, "fingerprint" refers to a pattern on the skin inside a human fingertip or a trace of it, "ridge" in the fingerprint refers to a line where the entrances of sweat glands in the skin of the human fingertip are raised, and "valley" refers to the indentation between ridges.

Figure 2:
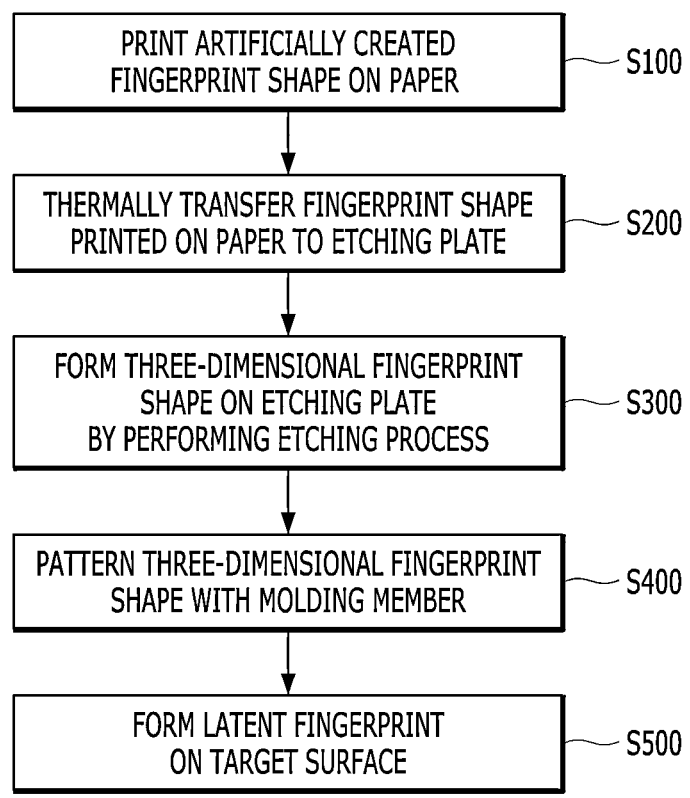
FIG. 2 is a flowchart illustrating a method of generating artificial latent fingerprints for latent fingerprint development experiments, according to an embodiment.
Figure 3:
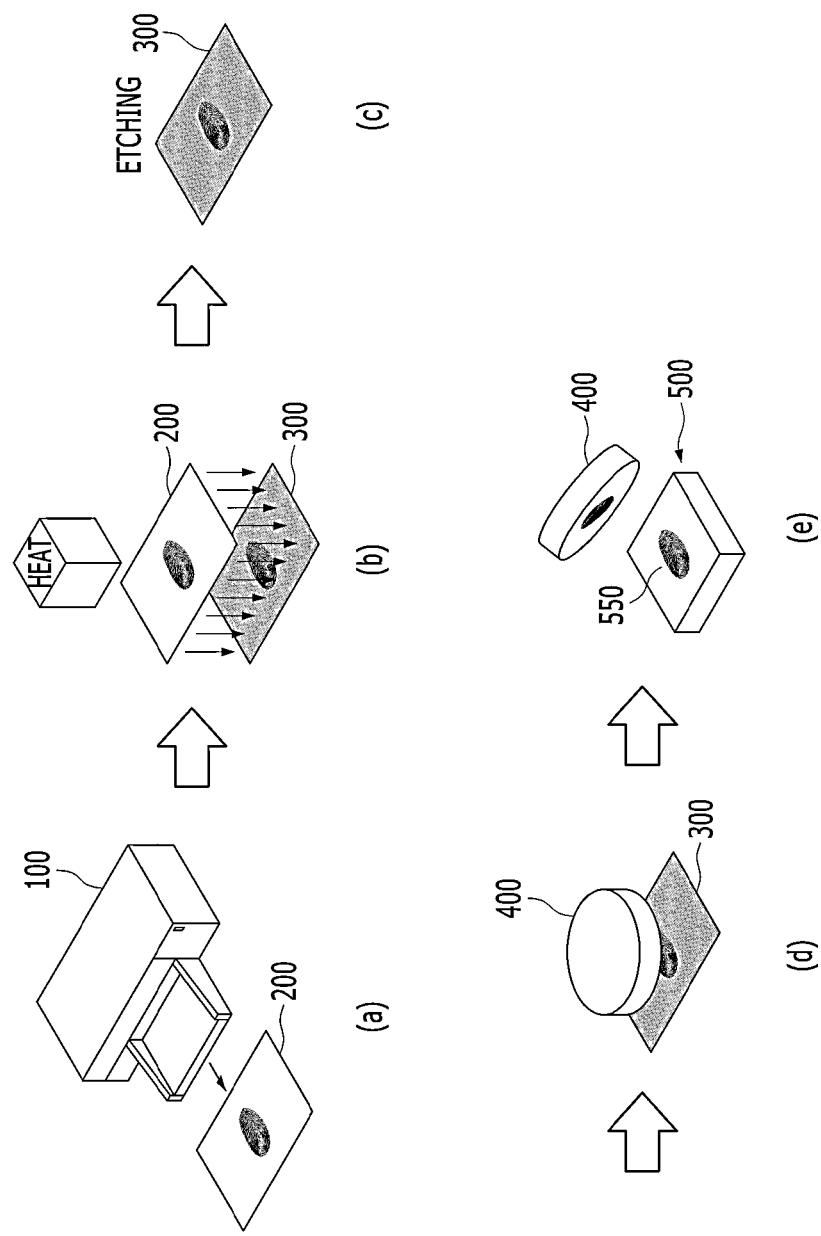
FIG. 3 is a view illustrating each operation of a method of generating artificial latent fingerprints for latent fingerprint development experiments, according to an embodiment.

FIG. 1 is a view of a general fingerprint shape found on a surface of an object and a fingerprint shape in which the color of the general fingerprint shape is inverted. FIG. 2 is a flowchart illustrating a method of generating artificial latent fingerprints for latent fingerprint development experiments of the disclosure. FIG. 3 is a view illustrating each operation of a method of generating artificial latent fingerprints for latent fingerprint development experiments of the disclosure.

Referring to FIGS. 1 to 3, the method of generating artificial latent fingerprints for latent fingerprint development experiments according to an embodiment is as follows.

Operation S100 is printing an artificially created fingerprint shape on paper to be applied to a target surface 550.

FIG. 1 (*a*) is a general fingerprint shape found on a surface of an object, and FIG. 1 (*b*) is a fingerprint shape obtained by inverting the color of FIG. 1 (*a*).

When a human finger contacts a colored substance such as ink or paint, and then touches a surface of an object so that a fingerprint may be checked with the naked eye, in a general fingerprint shape found on a surface of an object as shown in FIG. 1 (*a*), a ridge 1 may appear colored (or black), and a valley 3 may appear as a blank (or white).

FIG. 1 (*b*) is a view in which the color of FIG. 1 (*a*) is inverted, wherein the ridge 1 may appear as a blank (or white), and the valley 3 may appear colored (or black).

In this case, the artificially created fingerprint shape to be applied to the target surface 550 is a form in which the color of the general fingerprint shape found on the surface of the object is inverted. In this way, when a fingerprint shape in which the color of a general fingerprint shape found on a surface of an object is inverted is used, a latent fingerprint such as a form that may be found at a crime scene may be formed on the target surface 550 to be finally applied. This will be described later below.

The artificially created fingerprint shape to be applied to the target surface 550 is for experimentation for the study of a latent fingerprint development technique. Because an evaluation of reagents and methods in an experiment for the development of a latent fingerprint development technique determines the degree of latent fingerprint development regardless of determination of characteristics of the individual fingerprint of a person, it is sufficient to use an artificially created fingerprint shape without creating a fingerprint by directly touching a human finger. The artificially created fingerprint shape may be easily created by searching through the Internet, and does not directly include human information, so there is an advantage in that the artificially created fingerprint shape does not require permission from the Institutional Review Board (IRB).

Meanwhile, as shown in FIG. 3 (*a*), operation S100 of printing the fingerprint shape on paper may be performed using a printer 100. For example, the printer 100 may include a laser printer or an inkjet printer. The printer 100 is not limited to the above example, and may be performed using various types of printers. On the other hand, the type of ink or toner used in the printer 100 used when printing a fingerprint shape on paper is not limited to a specific type.

At this time, a fingerprint shape artificially created to be applied to the target surface 550 maintains the same shape as a fingerprint shape printed on paper 200.

At this time, the paper 200 used for printing may include photo paper, glossy paper, etc., in addition to dedicated printing paper that may be used in the printer 100, but is not limited to these examples. For example, thermal transfer operation S200 to be described later below may be more easily performed by using glossy paper rather than using matte paper as the paper 200 used for printing.

Operation S200 is thermally transferring the fingerprint shape printed on the paper 200 to an etching plate 300 by applying a certain range of heat and pressure to the paper 200 on which the fingerprint shape is printed.

Referring to FIG. 3 (*b*), when the paper 200 on which the fingerprint shape is printed is placed on the etching plate 300 and a certain range of heat and pressure is applied, the fingerprint shape printed on the paper 200 may be transferred to the etching plate 300.

In the fingerprint shape printed on the paper 200, a portion on which ink (or toner) is applied may be transferred to the etching plate 300 as it is, and may appear as a line. Therefore, the fingerprint shape printed on the paper 200 may be the same as the fingerprint shape transferred to the etching plate 300.

A fingerprint shape artificially created to be applied to the target surface 550 may be printed on the paper 200 as it is, and transferred to the etching plate 300 while maintaining the same form.

At this time, the etching plate 300 may use a metal such as copper, which will be described later in the following operations.

For example, when the etching plate 300 is made of copper, the paper 200 may be placed on the etching plate 300 and a certain range of pressure and temperature may be applied on the paper 200 using an iron. In this case, the heating temperature may be 200° C. or higher.

Operation S300 is forming a three-dimensional fingerprint shape on the etching plate 300 by performing an etching process according to the fingerprint shape transferred to the etching plate 300.

Etching is a plastic-processing method or surface-processing method using chemical corrosion. Etching is a method of obtaining a desired shape by corroding and removing unnecessary portions after performing anticorrosive treatment on a required portion.

The etching plate 300 used in the etching process may be a metal plate such as copper, stainless steel, or zinc. However, the etching plate 300 is not limited thereto, and may be made of any material as long as it is corrosive.

A chemical reaction is performed by dropping an etchant in an amount that may cover the entire transferred fingerprint shape on the etching plate 300. A certain amount of the etchant may be dropped by using a disposable dropper or a disposable pipette. In this process, a chemical reaction occurs between the etching plate 300 and a certain amount of the etchant. When the chemical reaction between the etching plate 300 and the etchant stops, a hygroscopic paper such as tissue paper may be used to remove the etchant remaining after the chemical reaction.

The etchant may cause corrosion on portions of the fingerprint shape transferred to the etching plate 300 except for lines. After the chemical reaction, lines of the etching plate 300 may form relief on the etching plate 300, and portions other than the lines may form intaglio. In this way, relief and intaglio are formed on the etching plate 300 to form a three-dimensional fingerprint.

For example, when the etching plate 300 is made of copper, a chemical reaction equation shown in the etching process is as follows.

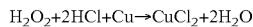

$$H_2O_2 + 2HCl + Cu \rightarrow CuCl_2 + 2H_2O$$

Because characteristics and microstructures vary according to the type of the etching plate 300, an etchant used for corrosion of the etching plate 300 may also be used in various ways according to the type of the etching plate 300.

For example, when the etching plate 300 is made of copper, the etchant used may be a solution in which 23% hydrochloric acid, 35% hydrogen peroxide, and water are mixed in a 1:1:1 ratio.

In operation S400, the three-dimensional fingerprint shape formed on the etching plate 300 is patterned with a molding member 400.

In this case, the molding member 400 is a member having a property that may draw a pattern according to the three-dimensional fingerprint shape formed on the etching plate 300. For example, the molding member 400 may include silicone, gelatin, various impression materials, and the like. The molding member 400 is not limited thereto. The molding member 400 has a liquid shape, and forms a shape along the intaglio and the relief of the three-dimensional fingerprint shape on the etching plate 300 and gradually hardens, so that a pattern may be drawn along the three-dimensional fingerprint shape.

For example, a case of using silicon as the molding member 400 will be described.

A frame (not shown) is located on the etching plate 300 to surround the three-dimensional fingerprint shape of the etching plate 300. When silicone and curing agent are mixed and injected into such a frame, silicone with fluidity forms a pattern along the intaglio and relief portions of the three-dimensional fingerprint shape. As time passes, the silicone gradually hardens, allowing the pattern to follow the three-dimensional fingerprint shape. At this time, the intaglio portion in the three-dimensional fingerprint shape formed on the etching plate 300 may be represented by relief in the molding member 400 with the pattern, and the relief portion in the three-dimensional fingerprint shape formed on the etching plate 300 may be represented by intaglio in the molding member 400 with the pattern.

Silicone has high heat resistance, and has high tensile strength and elasticity compared to general rubber. Therefore, after patterning a three-dimensional fingerprint shape on silicon, a latent fingerprint may be repeatedly formed by applying a certain force to the silicon.

For example, when gelatin is used as the molding member 400, a gelatin aqueous solution may form a gel while forming a shape along the intaglio and relief portions of the three-dimensional fingerprint shape of the etching plate 300, thereby drawing a pattern. Because gelatin has reversible thermal properties, the molding member 400 has the advantage of being able to reversibly change the state of the gelatin aqueous solution and the gel depending on the temperature.

Operation S500 is forming a latent fingerprint on the target surface 550 using an artificial fingerprint solution from the three-dimensional fingerprint shape formed by patterning with the molding member 400.

The artificial fingerprint solution may include a human body fluid component. For example, the artificial fingerprint solution may include amino acid components such as serine, glycine, alanine, lysine, leucine, threonine, asparagin acid, histidine, and valine, which are human body fluid components. Components such as sodium chloride and distilled water may be further included. As such, the artificial fingerprint solution may be prepared to have properties similar to human body fluid components.

A target member 500 on which the target surface 550 is formed may include metal, glass, corrugated board, or wood. The target member 500 may be a member having a rough surface or irregularities formed on the surface, in addition to a member having a flat surface such as paper. As long as it is made of a material in which a latent fingerprint may be found in a crime scene, the target member 500 is not limited to a specific member.

In the method of generating artificial latent fingerprints for latent fingerprint development experiments according to an embodiment of the disclosure, a fingerprint shape that appears in each operation will be described.

Operation S100 is printing an artificially created fingerprint shape on paper to be applied to the target surface 550.

In operation S100, the artificially created fingerprint shape to be applied to the target surface 550 is applied in a form obtained by inverting the color of a general fingerprint shape found on a surface of an object. Accordingly, as shown in FIG. 1 (b), in the form obtained by inverting the color of a general fingerprint shape found on a surface of an object, the ridge 1 of the fingerprint appears as a blank (or white), and the valley 3 of the fingerprint appears colored (or black). Because the artificially created fingerprint shape to be applied to the target surface 550 is printed on the paper 200 in the same manner, likewise, in the fingerprint shape printed on the paper 200, ridges appear as blanks (or white) and valleys appear colored (or black).

Operation S200 is thermally transferring the fingerprint shape printed on the paper 200 to the etching plate 300 by applying a certain range of heat and pressure to the paper 200 on which the fingerprint shape is printed.

The fingerprint shape printed on the paper 200 is a form obtained by inverting the color of a general fingerprint shape. Accordingly, a portion of the paper 200 that is printed with ink (or toner) on it is a valley portion, and a portion that is output as a blank is a ridge portion. By operation S200, in the fingerprint shape printed on the paper 200, the portion of the paper 200 that is printed with ink (or toner) on it is transferred to the etching plate 300 as it is to form a line. Accordingly, in a fingerprint shape transferred to the etching plate 300, a valley portion forms a line, and a ridge portion forms a blank.

Operation S300 is forming a three-dimensional fingerprint shape on the etching plate 300 by performing an etching process according to the fingerprint shape transferred to the etching plate 300.

When the etching process is performed, a chemical reaction occurs between the etchant and the etching plate 300. The etchant may cause corrosion on the etching plate except for an ink (or toner)-stained line. Accordingly, in the fingerprint shape transferred to the etching plate 300, corrosion occurs in the ridge portion forming the blank, and the valley portion forming the line remains. During the etching process as described above, the fingerprint shape transferred to the etching plate 300 forms a three-dimensional fingerprint shape. At this time, the valley portion formed as the line on the etching plate 300 is formed as relief, and the ridge portion formed as the blank on the etching plate 300 is formed as intaglio.

In operation S400, the three-dimensional fingerprint shape formed on the etching plate 300 is patterned with the molding member 400.

For example, when silicon is used as the molding member 400, silicon in a liquid state contacts a portion formed in the etching plate 300 by relief and intaglio. As the silicon hardens as time elapses, patterned silicon is formed in a form in which the relief and the intaglio of the etching plate 300 are replaced with each other. Therefore, in the silicon, a valley portion is formed as intaglio and a ridge portion is formed as relief.

In the patterned molding member 400, the ridge portion is raised and formed into relief, and the valley portion is recessed and formed into intaglio. This is a structure formed in such a way that a raised portion of a human finger appears as a ridge and a recessed portion appears as a valley.

Operation S500 is forming a latent fingerprint on the target surface 550 using an artificial fingerprint solution from the three-dimensional fingerprint shape formed by patterning with the molding member 400.

The artificial fingerprint solution is made of a component similar to a body fluid, such as human sweat, and may be patterned on the target surface 550 by applying the artificial fingerprint solution in the three-dimensional fingerprint shape formed by patterning with the molding member 400. This may form the same fingerprint shape as sweat flows out of a human finger and forms a latent fingerprint on the target surface.

Currently, a method of forming latent fingerprints on general printing paper or transparent label paper by using an artificial fingerprint solution similar to a human body fluid component as ink for inkjet printers is being used. However, as described above, a method of generating artificial latent fingerprints for latent fingerprint development experiments according to embodiments, after forming a fingerprint shape of a human fingertip on the molding member 400 such as gelatin or silicone in the same way as in reality, may form a latent fingerprint on various target surfaces 550 such as glass, corrugated cardboard, and wood by applying an artificial fingerprint solution to the molding member 400. According to the method, it is possible to form a latent fingerprint on the target surface 550 of various target members 500 such as metal, glass, corrugated board, wood, etc., which have a non-smooth surface, in addition to flat paper.

In this way, when a fingerprint shape is formed on the molding member 400 such as gelatin or silicon without using a human fingerprint, a uniform form of latent fingerprint may be repeatedly generated by applying a certain force, unlike a human finger, to the molding member 400. Through this, the reliability of a latent fingerprint development experiment may be improved.

In addition, it is possible to simplify an experiment procedure by omitting an approval procedure of the IRB regarding human body information that occurs when conducting experiments using human fingerprints.

As described above, according to an embodiment of the disclosure, a latent fingerprint development experiment may be more efficiently performed, thereby contributing to effective resolution of a criminal case.

According to embodiments of the disclosure, by forming a fingerprint shape on a molding member to reproduce a fingerprint shape at a human fingertip, latent fingerprints may be created on various target surfaces as found at crime scenes, so that more effective crime case resolution may be expected.

According to embodiments of the disclosure, by forming a fingerprint shape on a molding member such as silicon or gelatin to reproduce a fingerprint shape at a human fingertip, a uniform latent fingerprint may be generated by applying a certain force.

The embodiments of the disclosure do not directly use human fingerprints, but use artificially created fingerprints, and do not go through an exhaustive approval procedure of the Institutional Review Board (IRB), and thus economic efficiency may be expected in terms of experimental procedures.

It should be understood that embodiments described herein should be considered in a descriptive sense only and not for purposes of limitation. Descriptions of features or aspects within each embodiment should typically be considered as available for other similar features or aspects in other embodiments. Therefore, the scope of the disclosure is defined by the appended claims.

What is claimed is:

1. A method of generating artificial latent fingerprints for latent fingerprint development experiments, the method comprising:
    printing an artificially created fingerprint shape on paper for application to a target surface;
    thermally transferring the fingerprint shape printed on the paper to an etching plate by applying a certain range of heat and pressure to the paper on which the fingerprint shape is printed;
    forming a three-dimensional fingerprint shape on the etching plate by performing an etching process according to the fingerprint shape transferred to the etching plate;
    patterning the three-dimensional fingerprint shape formed on the etching plate with a molding member; and
    forming a latent fingerprint on the target surface using an artificial fingerprint solution from the three-dimensional fingerprint shape formed by patterning with the molding member.

2. The method of claim 1, wherein the printing of the fingerprint shape on paper is performed by a laser printer or an inkjet printer.

3. The method of claim 1, wherein the thermal transferring is performed at a heating temperature of 200° C. or higher when the etching plate is made of copper.

4. The method of claim 1, wherein the forming of the three-dimensional fingerprint shape on the etching plate is performed using an etchant in which 23% hydrochloric acid, 35% hydrogen peroxide, and water are mixed in a 1:1:1 ratio when the etching plate is made of copper.

5. The method of claim 1, wherein the molding member comprises gelatin or silicone.

6. The method of claim 1, wherein a target member on which the target surface is formed comprises metal, glass, corrugated board, or wood.

7. The method of claim 1, wherein the artificial fingerprint solution comprises a human body fluid component.

\* \* \* \* \*